United States Patent [19]
Trentino

[11] Patent Number: 5,550,508
[45] Date of Patent: Aug. 27, 1996

[54] PHASE INVERTER SELECTION APPARATUS FOR TONE ALTERATION IN A TUBE-TYPE AUDIO AMPLIFIER

[76] Inventor: Salvatore J. Trentino, 800 Sir Francis Drake Blvd., Suite A, San Anselmo, Calif. 94960

[21] Appl. No.: 371,023

[22] Filed: Jan. 9, 1995

[51] Int. Cl.⁶ .................................................. H03F 17/00
[52] U.S. Cl. ........................... 330/59; 327/257; 381/97
[58] Field of Search ............................. 330/59, 96, 107, 330/189; 381/120, 97; 327/256, 257

[56] References Cited

U.S. PATENT DOCUMENTS 3,493,669  2/1970  Elbrecht et al. ...................... 330/107
4,637,044  1/1987  Rindal ................................. 327/257 X

*Primary Examiner*—Steven Mottola
*Attorney, Agent, or Firm*—Larry D. Johnson

[57] ABSTRACT

A tonal altering feature for a tube type guitar audio amplifier provides apparatus enabling selection of the type of phase inverter utilized.

11 Claims, 2 Drawing Sheets

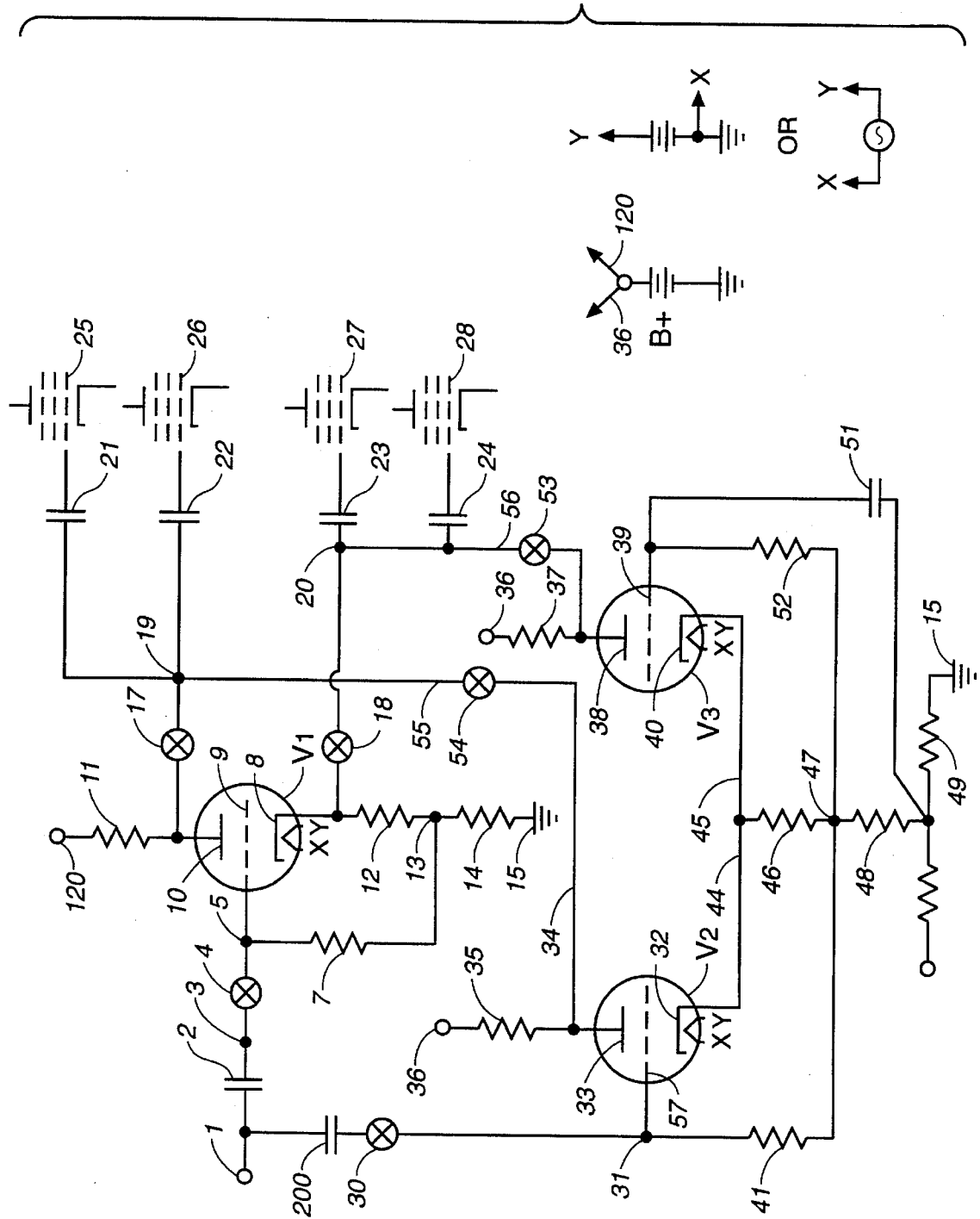
FIG._1

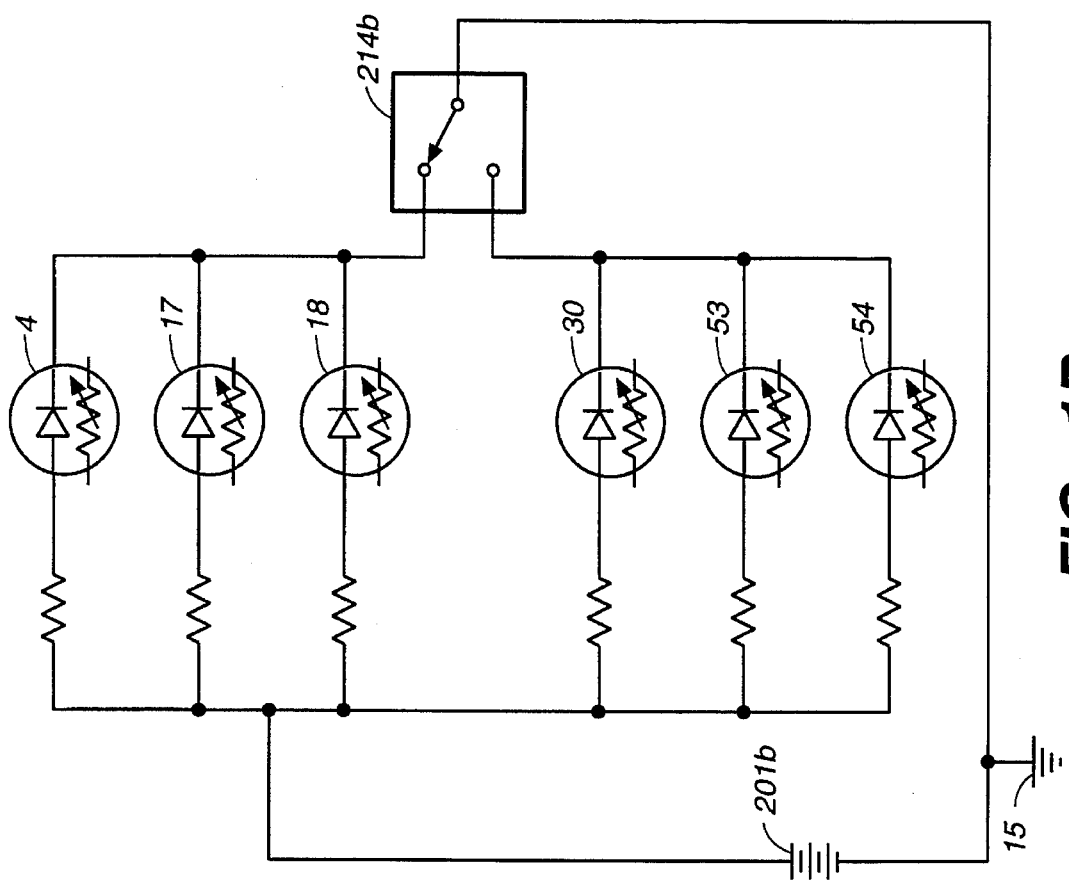
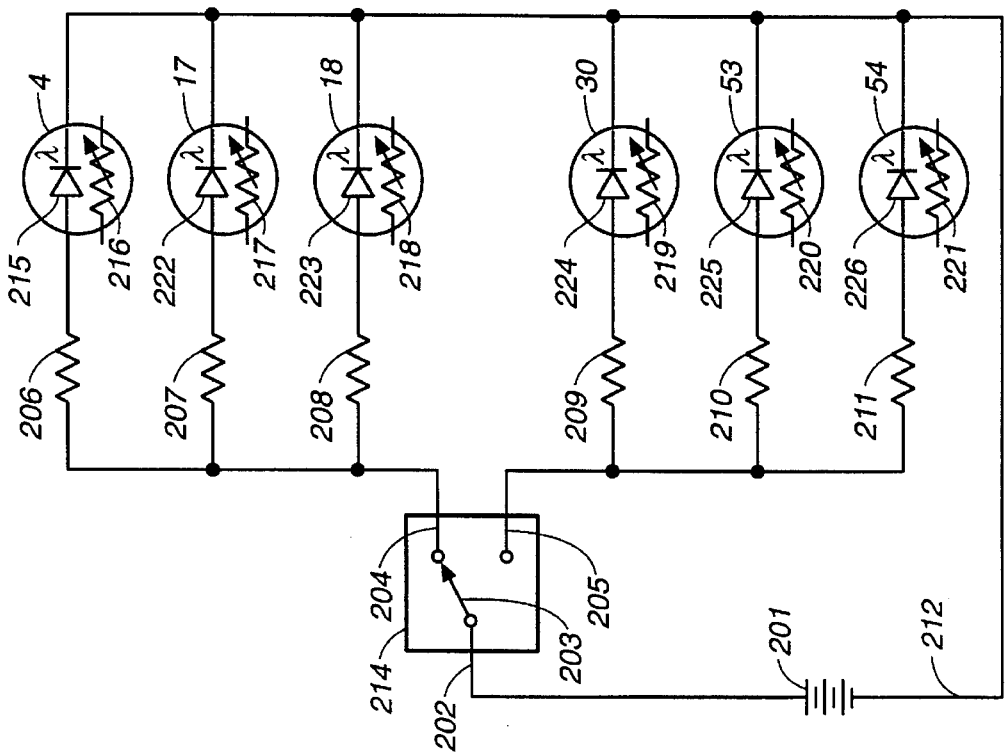
FIG._1B
FIG._1A

PHASE INVERTER SELECTION APPARATUS FOR TONE ALTERATION IN A TUBE-TYPE AUDIO AMPLIFIER

This application is related to co-pending applications Ser. No. 08/371,022 for an OUTPUT TUBE BIAS SELECTION APPARATUS FOR TONE ALTERATION IN A TUBE-TYPE AUDIO AMPLIFIER, and Ser. No. 08/371,021 for an OUTPUT POWER SELECTION APPARATUS FOR A TUBE-TYPE AUDIO AMPLIFIER, filed concurrently herewith by applicant herein.

BACKGROUND OF THE INVENTION

1. Field of the Invention

This invention relates generally to tube-type audio amplifiers, and more specifically to a phase inverter selection apparatus enabling tone alteration of the output signal.

2. Description of the Prior Art

Tube-type audio amplifiers may utilize either a "split load" type phase inverter or a "long tailed pair" (differential) type phase inverter. However, no known amplifiers enable selective switching between these two types of phase inverters.

SUMMARY OF THE INVENTION

This invention provides a tonal altering feature for a tube type guitar audio amplifier in the form of circuitry enabling the selection of the type of phase inverter utilized. The different selections will significantly vary the character and tone coloration of the amplifier in reproducing the guitar's signal, especially when the amplifier is driven into the nonlinear portions of operating parameters (as guitarists often use their amplifiers).

BRIEF DESCRIPTION OF THE DRAWINGS

FIG. 1 is a schematic view of phase inverter circuitry for a tube-type audio amplifier;

FIG. 1a is a schematic view of one embodiment of a user interface enabling selection of the phase inverter; and FIG. 1b is a schematic view of an alternate embodiment of a user interface enabling selection of the phase inverter.

DETAILED DESCRIPTION OF A PREFERRED EMBODIMENT

This invention provides two types of phase inverters which can be electronically selected by the user. FIG. 1 shows both the "split load" type of phase inverter comprising tube V1 and its associated circuitry, and the "long tailed pair" (differential) type of phase inverter comprising tubes V2 and V3 and their associated circuitry. When one type of phase inverter is selected, the other type of phase inverter is deselected. The following is a description of how this phase inverter selector functions:

In FIG. 1a, we see one version of the user interface which selects between the phase inverters. A battery or other power supply is illustrated as 201. One side 212 of the power supply goes to the cathodes of all the light emitting diodes 215, 222, 223, 224, 225 and 226 in common. The other side 202 of this power supply goes to the operator's switch 214. This switch's wiper contact 203 sends the power available from 201 to one of terminals 204 or 205. When the wiper 203 is in the upper position, the available voltage is applied to terminal 204 and then on to current limiting resistors 206, 207 and 208 which protect the light emitting diodes in the opto-isolators 4, 17, and 18 from excessive current. An associated light dependent resistor 216, 217, 218 is included in each opto-isolator.

As an example, the energized resistor 206 allows the light emitting diode 215 to emit light. This emitted light falls upon the light dependent resistor 216 which is also encased inside of the opto-isolator 4. Upon being illuminated, this light dependent resistor 216 drops in resistance from its unilluminated megohm resistance to several thousand ohms, effectively behaving like a single pole, single throw switch. The other two opto-isolators 17, 18 shown connected to terminal 204 behave in a similar manner, such that all three opto-isolators 4, 17 and 18 go to a low resistance state at the same time, connecting the upper phase inverter V1 (shown in FIG. 1) to the associated output tubes. Since no power is available to the lower three opto-isolators 30, 53 and 54 (as terminal 205 is disconnected from the power supply), their light dependent resistors are in the high resistance state, and behave like open switches, effectively disconnecting the lower phase inverter V2 and V3 (FIG. 1) from the output tubes. Now, if the user interface switch 214 is activated to its other position such that the incoming voltage is impressed upon terminal 205 via wiper contact 203, then the previously energized opto-isolators 4, 17 and 18 are de-energized and are now in a high resistance (open) state, while the opto-isolators 30, 53 and 54 are now energized via their current limiting resistors 209, 210 and 211, and their light emitting diodes 224, 225, 226 are illuminated. Therefore their associated light dependent resistors 219, 220 and 221 are now in a low resistance state, effectively connecting the lower phase inverter V2 and V3 (FIG. 1) to the output tubes.

In FIG. 1b, a slightly different method of activating these same opto-isolators 4, 17, 18, 30, 53, 54 is shown. In this illustration, all of the opto-isolators' anodes are connected to the plus side of the power supply 201b (through their respective current limiting resistors), and the cathode sides, which are grouped into two or more groups for the two or more drivers, are selectively energized by the user switch 214b. The advantage of this latter configuration is that remote switching is more convenient, as a simple switch closure to ground 15 (one side of the supply is grounded, or fed to the chassis) will allow safe remote selection of the drivers (a shorted cable or connector will not damage the circuitry).

These LED light dependent resistor-type opto-isolators could be replaced with LED transistor-type opto-isolators or neon-tube LDR (light dependent resistor) opto-isolators, or electromechanical relays such as multi-contact, multi-pole relays, and still work equally well. Alternately, direct switching via a multipole multiposition switch would also work. However, use of opto-isolators keeps the audio signal paths short and the parasitic effects to a minimum.

Referring now back to FIG. 1, the preamplified signal is introduced at point 1, where the signal then goes to coupling capacitor 2 to point 3. In this case we will say that the upper split load phase inverter V1 is in use. Opto-isolator/switch 4 is therefore in a low resistance mode, allowing the signal to proceed to point 5, which is connected to the control grid 9 of the upper phase inverter V1, where that phase inverter's equal plate load and cathode resistors 11 and 14 produce two equal and opposite signals closely resembling the input signal at point 1. The signal at the cathode 8 of V1 is in phase with the input signal at point 1, while the signal at plate 10 of V1 is 180 degrees out of phase with that same input signal at point 1. The in phase signal at cathode 8 goes to opto-isolator/switch 18, which is also in a low resistance state, and then the signal proceeds to coupling capacitors 23 and 24 and then to the control grids 27 and 28 of the associated output tubes. The out of phase signal at the plate 10 of V1 goes to opto-isolator/switch 17, which is in a low resistance state, to point 19 and then to coupling capacitors 21 and 22, whence the signal goes to the associated output tube grids 25 and 26. In this mode, opto-isolator/switches 4, 17 and 18 are in a low resistance state, while opto-isolator/switches 30, 53 and 54 are in a high resistance state. The upper phase inverter V1 is thus enabled, while the lower phase inverter V2, V3 is disabled.

Now in the opposite mode of this part of the invention, the lower phase inverter (long tailed pair or differential type phase inverter V2 and V3) is enabled, while the upper phase inverter V1 is disabled. In this mode, the preamplified input signal at point 1 goes through capacitor 200 to switch 30, which is now in a low resistance state. The signal goes to point 31, and then to V2's control grid 57, where it is amplified by a triode section of that tube V2, and at the plate 33 of tube V2, the signal is 180 degrees out of phase with respect to the input signal at point 1. This signal at point 34 goes to low resistance switch 54, whence it goes to point 19, then to coupling capacitors 21 and 22, where the signal then goes to the output tubes control grids 25 and 26. This "long tailed pair", composed of tubes V2 and V3, is configured as a differential amplifier pair sharing the same cathode current coming through resistor 46. This current splits up at points 44 and 45 to tubes V2 and V3, respectively. Therefore, when the current in tube V2 is increasing, the current in tube V3 is decreasing, and vice-versa. This relationship is assisted by holding tube V3's grid 39 near alternating current ground 15 via capacitor 51 and low ohm resistor 49. This current sharing between tubes V2 and V3 provides nicely balanced 180 degree out of phase signals between the plates 33 and 38 of these two triode tube sections V2 and V3. Alternatively, V1, V2 and/or V3 could be pentodes. Another factor assisting this differential amplification is the cathode follower action provided by tube V2 which, in being directly coupled to tube V3's cathode (and with tube V3's grid 39, at relative A.C. ground) makes tube V3 similar to a grounded grid type of amplifier stage. Hence a signal is developed at tube V3's plate 38 which is 180 degrees out of phase with the signal of the plate 33 of tube V2. The signal at plate 38 goes to low resistance switch 53 to coupling capacitors 23 and 24, and then to the control grids of their associated output tubes 27 and 28. Thus, when the long tailed pair (differential) type phase inverter is enabled, switches 30, 53, and 54 are in a low resistance state (closed), while switches 4, 17 and 18 are in a high resistance state (open).

The following is a brief description of the remaining components illustrated in FIG. 1: 7 is the control grid bias resistor for vacuum tube V1. 12 is part of the cathode bias resistor chain of the split load phase inverter V1. 13 is part of the cathode bias resistor chain of the split load phase inverter V1. 20 is the junction point at which switches 18 and 53 join to feed the selected driver signal to the output tube(s) 27 and 28 when the push pull parallel configuration of output tube topology is employed. 32 is the cathode element in vacuum tube V2. 35 is the plate (anode) element load resistor for vacuum tube V2. 36 is the B plus supply feed point for the vacuum tubes V1, V's and V3. 37 is the plate (anode) element load resistor for the vacuum tube V3. 40 is the cathode element of vacuum tube V3. 41 is the grid bias resistor for the control grid of vacuum tube V2. 47 is a junction point in the cathode bias resistor chain of phase inverter V2 and V3. 48 is a resistor in the cathode bias circuit resistor chain of phase inverter V2 and V3. 52 is a grid bias resistor for the control grid of vacuum tube V3. 55 is a point in the circuit after switch 54 and is connected to point 19. Point 19 then feeds the selected phase inverter signal to the output tube or tubes 25 and in some cases 26, as when the parallel push pull configuration of output tube topology is used. 56 is a point in the circuit after switch 53 and is connected to point 20. Point 20 then feeds the selected phase inverter signal to the output tube or tubes 27 and in some cases 28, as when the parallel push pull configuration of output tube topology is used. 120 is a point in the B plus supply which feeds the plate load resistor 11 of vacuum tube V1.

While this invention has been described in connection with preferred embodiments thereof, it is obvious that modifications and changes therein may be made by those skilled in the art to which it pertains without departing from the spirit and scope of the invention. Accordingly, the scope of this invention is to be limited only by the appended claims.

What is claimed as invention is:

1. A phase inverter selection apparatus for tone alteration in a tube-type audio amplifier, said selection apparatus comprising:

an audio amplifier including a first type phase inverter and a second type phase inverter, each connected to associated output tubes;

a first opto-isolator array electrically connected to said first type phase inverter, said first opto-isolator array normally in a high resistance state;

a second opto-isolator array electrically connected to said second type phase inverter, said second opto-isolator array normally in a high resistance state;

power supply means selectively connected to one of said first opto-isolator array or said second opto-isolator array, wherein when said power supply means is connected to said first opto-isolator array, said first opto-isolator array is driven to a low resistance state to enable said first type phase inverter to connect to its associated output tubes, and said second opto-isolator array remains in a high resistance state effectively preventing said second type phase inverter from connecting to its associated output tubes, and when said power supply means is connected to said second opto-isolator array, said second opto-isolator array is driven to a low resistance state to enable said second type phase inverter to connect to its associated output tubes, and said first opto-isolator array remains in a high resistance state effectively preventing said first type phase inverter from connecting to its associated output tubes.

2. The phase inverter selection apparatus of claim 1 wherein said first type phase inverter comprises a differential type phase inverter.

3. The phase inverter selection apparatus of claim 1 wherein said second type phase inverter comprises a split load type phase inverter.

4. The phase inverter selection apparatus of claim 1 wherein said first opto-isolator array comprises at least one light emitting diode proximate an associated light dependent resistor.

5. The phase inverter selection apparatus of claim 4 wherein said first opto-isolator array comprises three light emitting diodes each proximate an associated light dependent resistor.

6. The phase inverter selection apparatus of claim 4 wherein said at least one light emitting diode is connected to a current limiting resistor.

7. The phase inverter selection apparatus of claim 1 wherein said second opto-isolator array comprises at least one light emitting diode proximate an associated light dependent resistor.

8. The phase inverter selection apparatus of claim 7 wherein said second opto-isolator array comprises three light emitting diodes each proximate an associated light dependent resistor.

9. The phase inverter selection apparatus of claim 7 wherein said at least one light emitting diode is connected to a current limiting resistor.

10. The phase inverter selection apparatus of claim 1 wherein said first opto-isolator array includes at least one neon-tube light dependent resistor.

11. A phase inverter selection apparatus for tone alteration in a tube-type audio amplifier, said selection apparatus comprising:

an audio amplifier including a first type phase inverter and a second type phase inverter, each connected to associated output tubes; and electromechanical switch means connected to said first type phase inverter and said second type phase inverter to select between said first type phase inverter and said second type phase inverter.

* * * * *